United States Patent
Vinciarelli et al.

(10) Patent No.: US 6,940,013 B2
(45) Date of Patent: Sep. 6, 2005

(54) SURFACE MOUNTING A POWER CONVERTER

(75) Inventors: Patrizio Vinciarelli, Boston, MA (US); Jay Prager, Groton, MA (US); Michael B. LaFleur, East Hampstead, NH (US)

(73) Assignee: VLT, Inc., Sunnyvale, CA (US)

( * ) Notice: Subject to any disclaimer, the term of this patent is extended or adjusted under 35 U.S.C. 154(b) by 0 days.

(21) Appl. No.: 10/714,323

(22) Filed: Nov. 14, 2003

(65) Prior Publication Data

US 2005/0103521 A1 May 19, 2005

(51) Int. Cl.[7] .............................. H02G 3/08; H05K 5/00
(52) U.S. Cl. ...................... 174/52.1; 361/760; 361/761; 361/773
(58) Field of Search .............................. 174/52.2, 52.4, 174/52.1; 257/696; 361/760, 761, 773

(56) References Cited

U.S. PATENT DOCUMENTS

| | | | |
|---|---|---|---|
| 4,655,519 A | 4/1987 | Evans et al. | |
| 5,526,234 A | 6/1996 | Vinciarelli et al. | |
| 5,969,952 A | * 10/1999 | Hayashi et al. | 361/774 |
| 5,984,692 A | 11/1999 | Kumagai et al. | |
| 6,147,398 A | * 11/2000 | Nakazato et al. | 257/696 |
| 6,211,564 B1 | * 4/2001 | Hatano | 257/686 |
| 6,433,417 B1 | * 8/2002 | Aoyama | 257/696 |
| 2002/0019153 A1 | 2/2002 | Audet et al. | |
| 2003/0038361 A1 | * 2/2003 | Nakamura | 257/696 |
| 2004/0100778 A1 | 5/2004 | Vinciarelli et al. | |

FOREIGN PATENT DOCUMENTS

DE 4420525 6/1995

OTHER PUBLICATIONS

U.S. Appl. No. 29/175,342, filed Feb. 3, 2003, "Power Converter".

* cited by examiner

Primary Examiner—Hung V. Ngo
(74) Attorney, Agent, or Firm—Fish & Richardson P.C.

(57) ABSTRACT

A power converter includes electrical contacts arranged on a first surface and a connection device. The converter has a top surface above the first surface and a bottom surface below the first surface. A border of the bottom surface is inset from a border of the second surface. The connection device includes a pair of conductive legs, each leg comprising a first end and a second end. The pair of legs lie opposite each other in a pair of evenly spaced planes that intersect the first surface. The first ends are adapted to connect to one or more of the contacts on the first surface and the second ends are adapted to connect to one or more conductive pads on a surface of a substrate. The connection device is adapted to enable the first ends of the two legs to connect to the contacts from below the first surface.

23 Claims, 16 Drawing Sheets

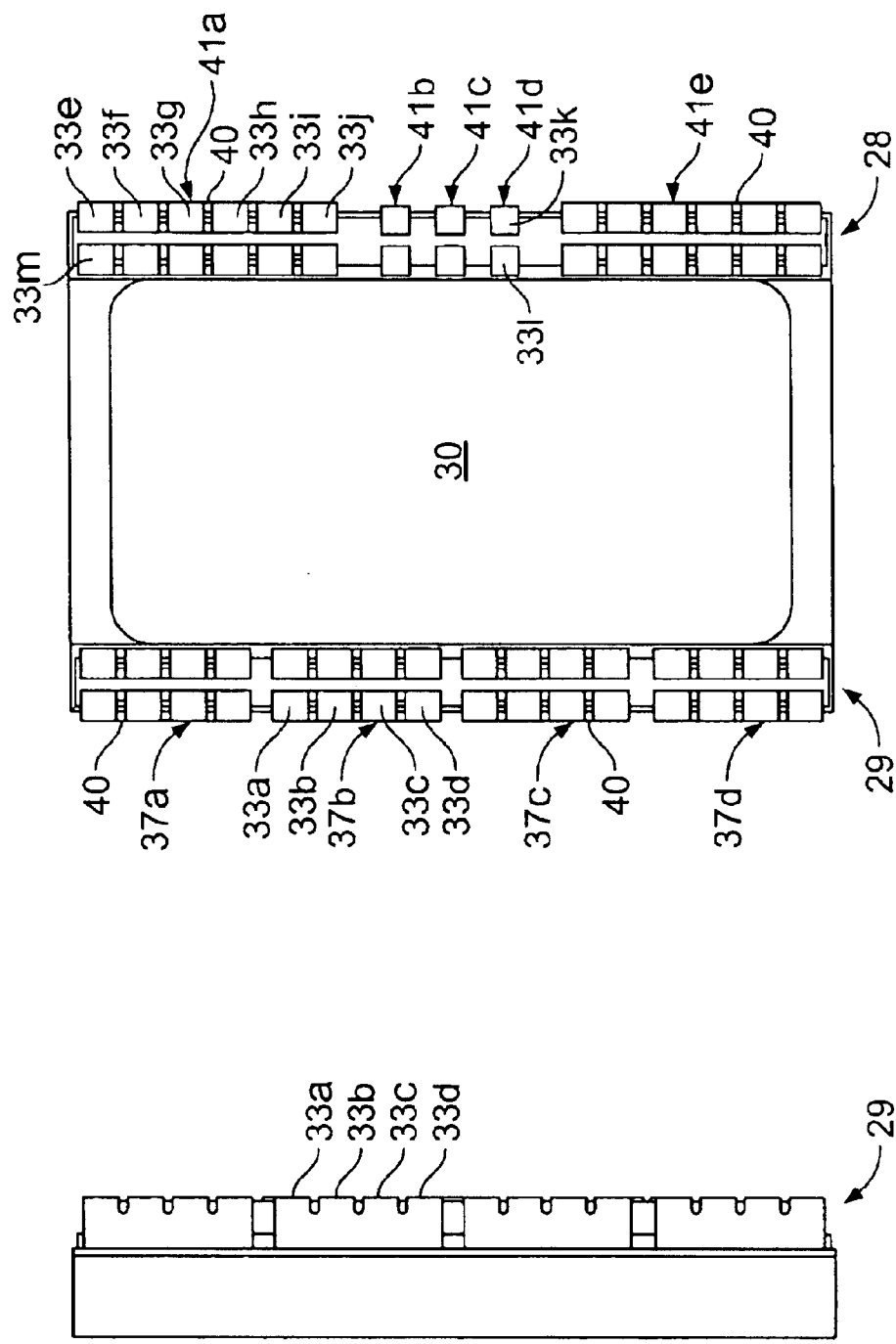

SURFACE MOUNTING A POWER CONVERTER

BACKGROUND

This description relates to surface mounting a power converter.

In some modular DC—DC power conversion products, the DC input voltage is greater than the DC output voltage, e.g., the input voltage may be 48 VDC, and the DC output voltage may be 1.8 VDC. With electronic circuits trending towards lower operating voltages, the output currents delivered by many DC—DC converters have increased.

DC—DC converters provide a so-called "pinout", for making connections to their inputs and outputs. An example of one such pinout is shown in FIG. 1. In the Figure, which is an exploded view of a DC—DC converter module 10 mounted on a printed circuit board 12, the DC—DC converter pinout comprises output voltage connection pins 14, input voltage connection pins 16 and input and output control pins 17. Because the output pins typically carry more current than the input pins their diameter (e.g., 0.080" (2.0 mm)) may be larger than the diameter (e.g., 0.040" (11.0 mm)) of the input and control pins. All of the pins are inserted into mating holes 18, 20 in the printed circuit board 12 and are soldered to etches 22, 24, 26 in and around the holes. Pins of the kind described above are useful up to about 40 Amperes. Above 40 Amperes, either larger diameter pins, or a plurality of pins, may be used.

DC—DC converters may also be mounted using surface mount power interconnections involving solder-ball-grid arrays or "J-lead" lead frames, examples of which are described or illustrated in U.S. patent application Ser. No. 10/303,613, "Power Converter Package and Thermal Management", filed on Nov. 25, 2002, and in U.S. Design Patent Application No. 29/175,342, "Power Converter Body" (referred to, respectively, as the "'613 application" and the "'342 application"), filed on Feb. 3, 2003, both assigned to the same assignee as this application and both incorporated here by reference. As described in the '342 application, and shown in FIG. 2, a power converter module 30 may be surface mounted to a substrate 34 by connecting the solder-ball-grid arrays 31a, 31b to corresponding conductive etch patterns 33a, 33b on the surface of the substrate 34. In the example shown in FIG. 2, the bottom surface of the power converter module extends through an aperture 35 in the substrate.

SUMMARY

In general, in one aspect, the invention features an apparatus comprising a power converter including electrical contacts arranged on a first surface and a connection device. The converter has a top surface above the first surface and a bottom surface below the first surface. A border of the bottom surface is inset from a border of the second surface. The connection device includes a pair of conductive legs, each leg comprising a first end and a second end. The pair of legs lie opposite each other in a pair of evenly spaced planes that intersect the first surface. The first ends are adapted to connect to one or more of the contacts on the first surface and the second ends are adapted to connect to one or more conductive pads on a surface of a substrate. The connection device is adapted to enable the first ends of the two legs to connect to the contacts from below the first surface.

Implementations of the invention may include one or more of the following features. The first ends and second ends of respective legs are spaced apart by a distance that is greater than a distance between the first surface and the bottom surface. The top and bottom surfaces are planar and are parallel to each other and to the first surface. The electrical contacts comprise a ball-grid array. The conductive pads comprise conductive etch. There are two or more pairs of legs in the pair of planes. The pair of legs are part of a strip of conductive material bent to form the pair of legs, each leg connected at a right angle to a spanning portion of the strip, the pair of legs being electrically connected together by the spanning portion. The spanning portion comprises the first ends of each of the two pair of legs. The legs of the pair are formed from separate pieces of conductive material. The second end of each leg is formed into a J. The J end of each leg is directed inward toward the other leg so that the two ends of the Js lie between the pair of legs. There are two or more pairs of legs held together by a non-conductive rib. The rib comprises a hole that exposes a portion of a pair of legs to form a first end. Each of the pairs of legs comprises a strip of conductive material bent to form the pair of legs, each leg connected at a right angle to a spanning portion of the strip, the pair of legs being electrically connected together by the spanning strip, and the rib comprises a hole that exposes a portion of the spanning strip to form a first end. The legs of a pair are formed from separate pieces of conductive material and the rib comprises holes that expose a portion of each leg to form a first end. The rib connects the pairs of legs so that the legs lie in the pair of planes.

In general, in another aspect, the invention features a method for making connections between (a) electrical contacts that are inset from a bottom surface of a power converter and (b) conductive pads located on a substrate. The method includes interposing between the contacts and the bottom surface, conductive segments that comprise two generally parallel conductive legs, each leg comprising a first end and a second end, the first ends of the two legs being connected to one or more of the electrical contacts and the second ends extending to a location below the bottom surface and connecting to one of more of the pads.

Implementations of the invention may include one or more of the following features. Additional conductive segments are provided, each conductive segment comprising pairs of generally parallel legs. The segments are arranged in a row using a non-conductive rib so that the generally parallel legs in each segment lie in two generally parallel planes. A ball-grid array of electrical contacts is provided on the power converter. Holes are provided in the rib to expose portions of first ends at locations along the rib that align with the locations of the balls in the ball-grid array. The ball-grid array is soldered to the exposed locations of the spanning portions. The free ends of the legs are folded into a J, and the J-shaped portions of the free ends are soldered to the conductive pads on the substrate. The distance is essentially equal to the maximum distance between the first surface and the bottom surface so that the bottom surface is just above, and in close proximity to, the surface of the substrate. The distance is greater than the maximum distance between the first surface and the bottom surface so that a gap exists between the bottom surface and the surface of the substrate. The distance may be twice the value of the maximum distance between the first surface and the bottom surface.

Other advantages and features of the invention will become apparent from the following description and from the claims.

DESCRIPTION

We first briefly describe the drawings:

FIGS. 4A–4D show orthographic views of the converter of FIG. 3.

Figure 1:
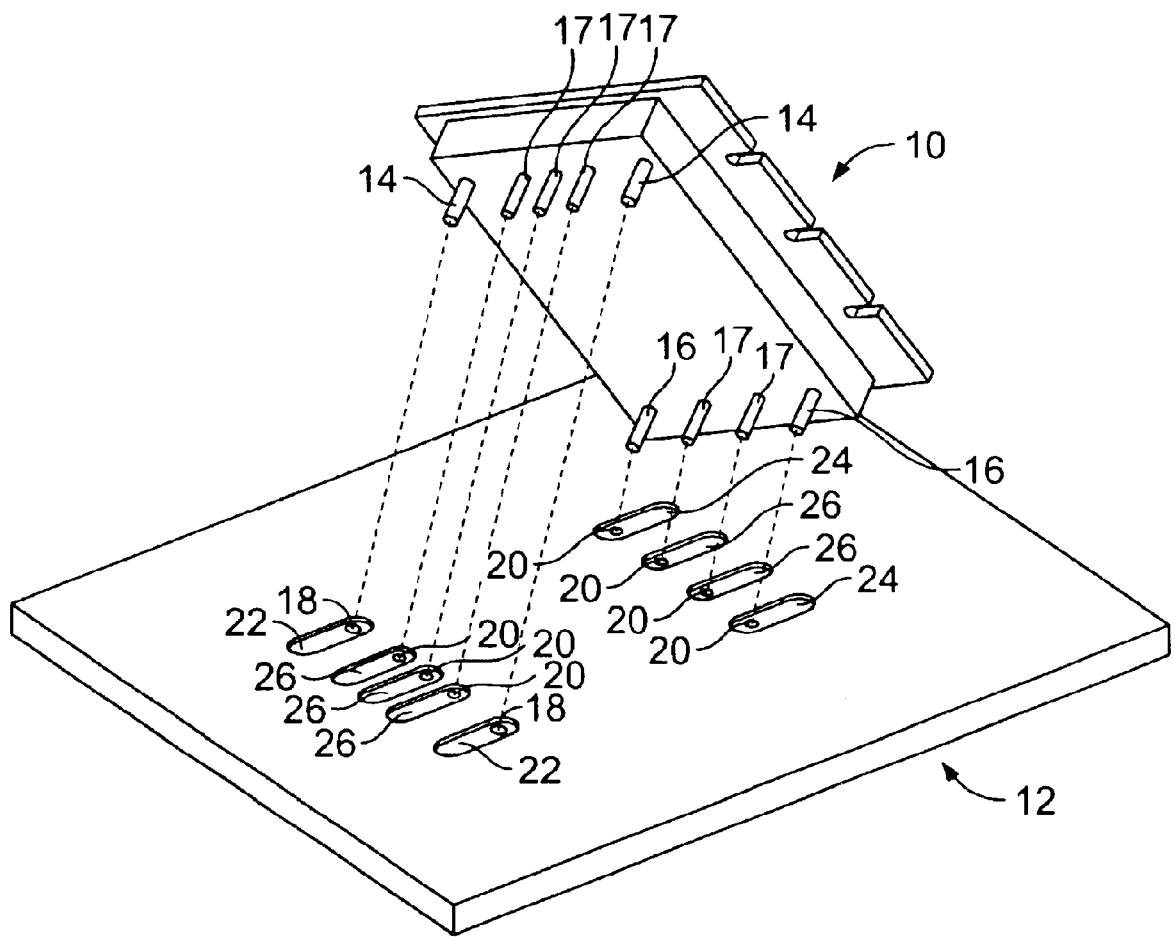
FIGS. 1 and 2 show exploded views of power converters and printed circuit boards.
Figure 2:
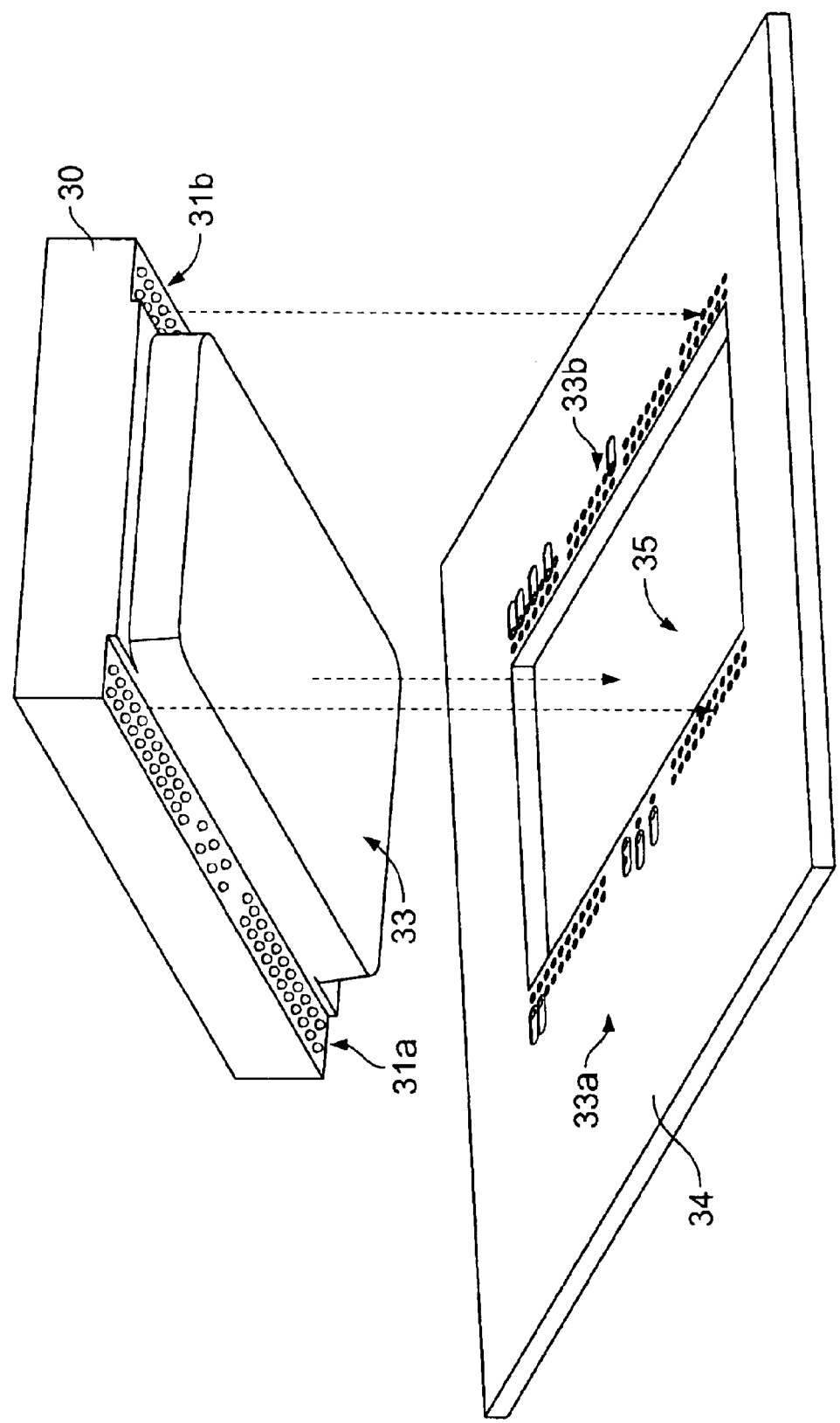
Figure 3:
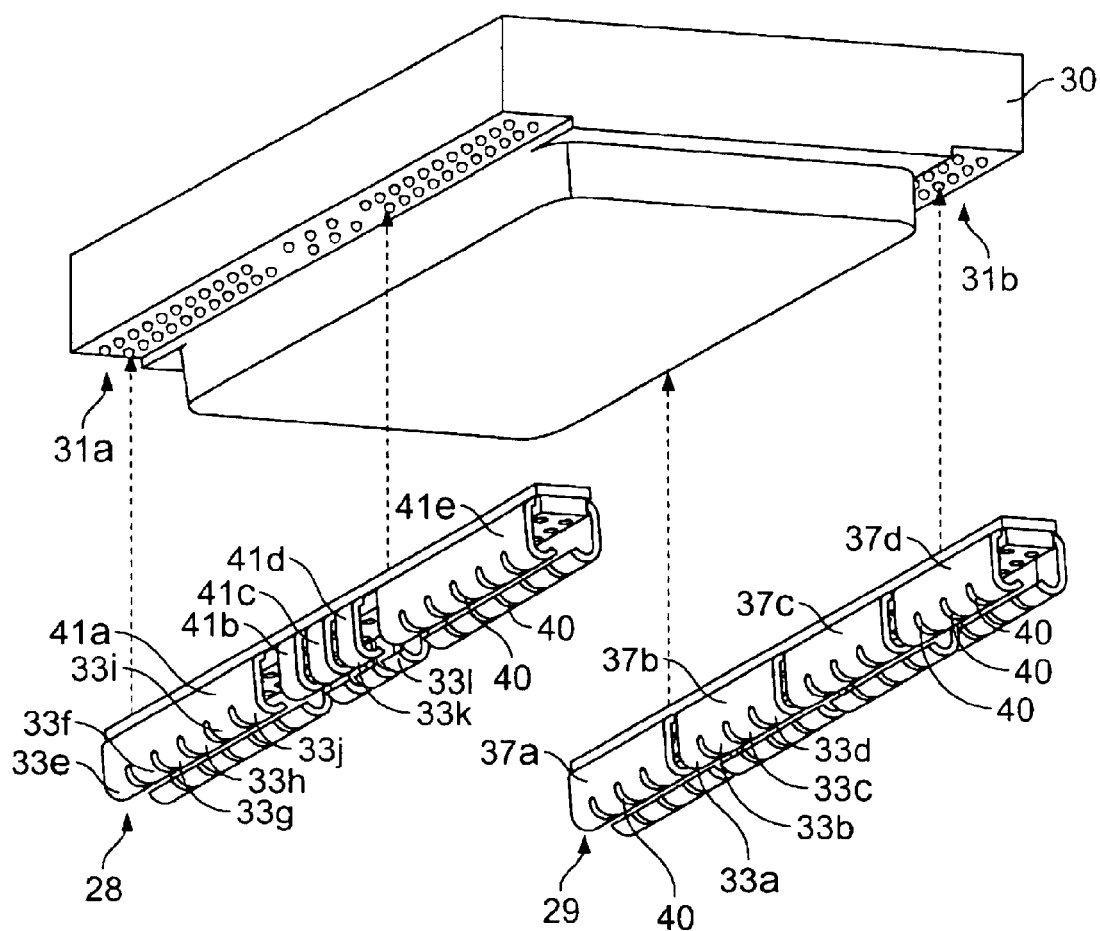
FIG. 3 shows an exploded view of a power converter and a connector system.
Figure 4A:
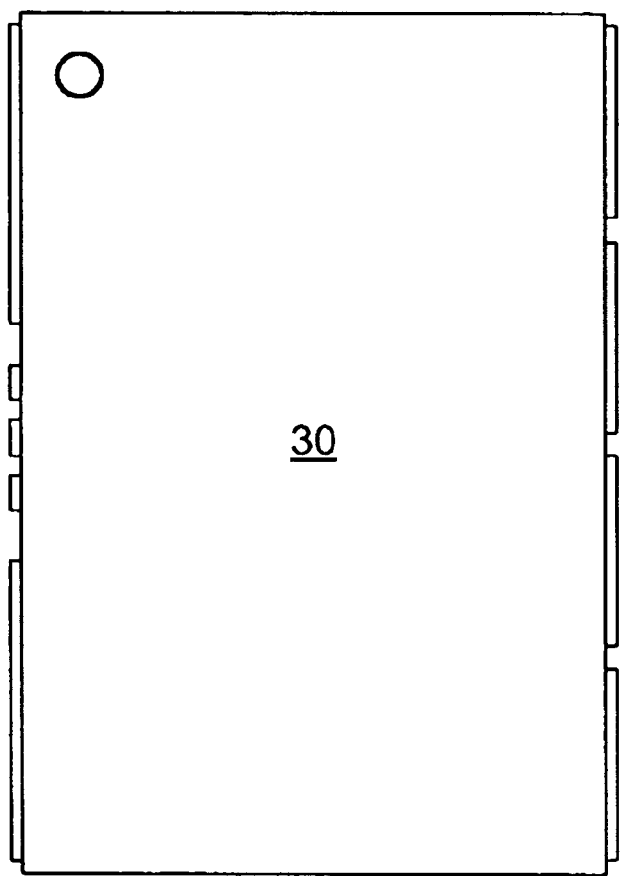
Figure 4B:
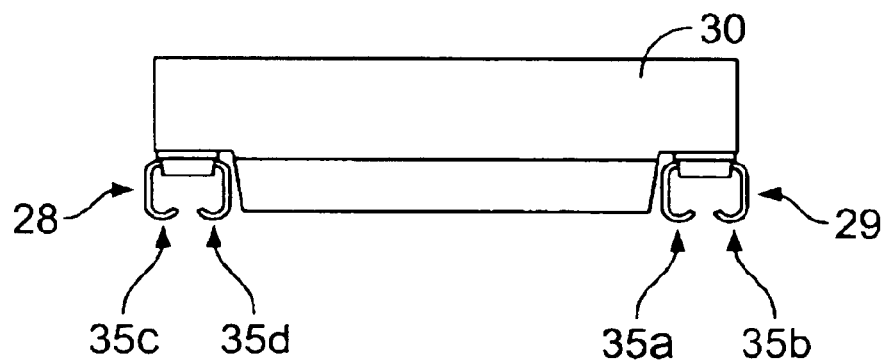
Figure 5:
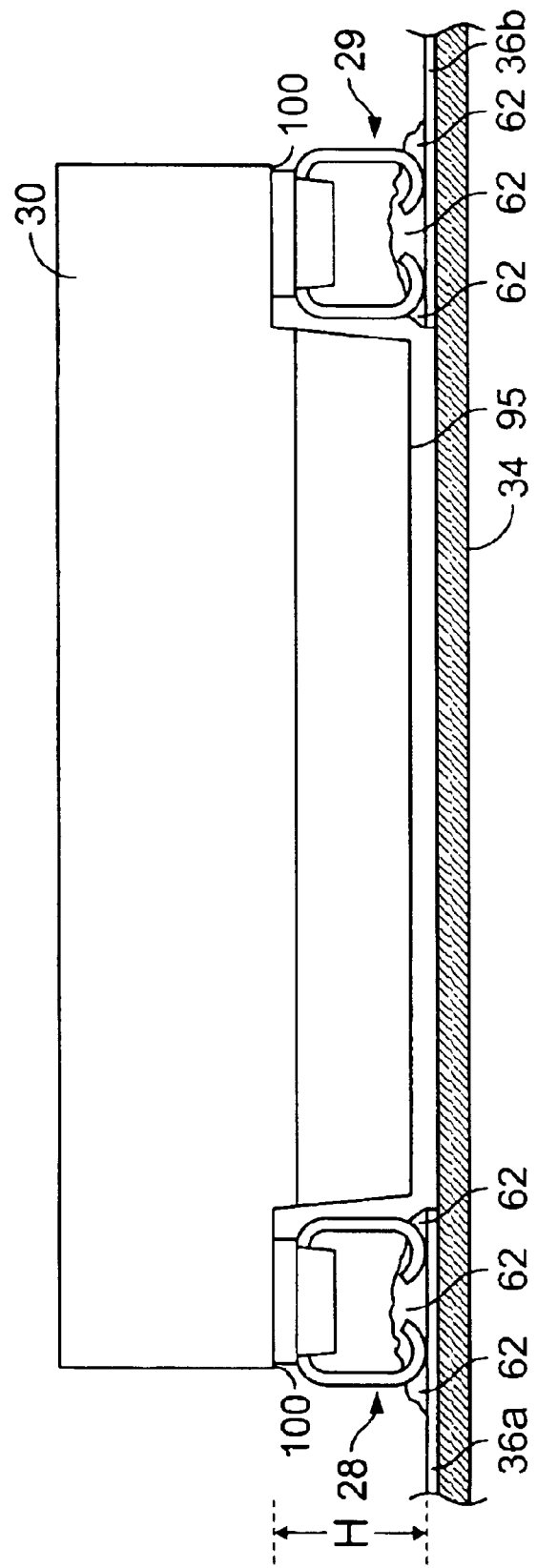
FIG. 5 shows an end view of the converter of FIG. 4 mounted to a substrate.

FIG. 3 shows an exploded perspective view, and FIGS. 4A through 4D show, respectively, top, end, side, and bottom plan views, of an assembly comprising a power converter module 30 and two bilateral J-lead connectors 28, 29, described below. In the Figures, the power converter module 30 comprises solder-ball-grid arrays 31a, 31b for making electrical connections (e.g., the power converter module is of the kind described or illustrated in the '613 and '342 applications (and shown in FIG. 2)). The bilateral J-lead connectors 28, 29 are attached to the power converter module 30 by means of the solder-ball-grid arrays 31a, 31b to form a surface mount connector system for the power converter module 30. As illustrated in FIG. 5, which shows the J-lead connectors 28, 29 of FIG. 4 connected by solder 62 to conductive pads 36a, 36b on a substrate 34 (e.g., a printed circuit board), an advantage of the structure is that the power converter module 30 may be surface mounted to a substrate 34 without the need for an aperture (35, FIG. 2) in the substrate. To avoid the need for an aperture, the minimum height of the J-lead connectors (i.e., the minimum value of the distance labeled "H" in FIG. 5), is no less than the vertical distance between the bottom surface of the power converter 95 and the surfaces 100 on which the ball grid array is mounted, if that surface is coplanar with the surface of the substrate that is adjacent to the bottom surface of the power converter. Another advantage of the structure is that its use does not materially affect the thermal performance of the power converter 30, because the J-leads can efficiently conduct heat generated within the power converter from the ball-grid array into the substrate 34. This heat may then be removed by convection from, or a flow of cooling air over, the leads and the substrate.

Referring to FIGS. 3, 4 and 5 the power converter module 30 comprises a top surface 102, two generally planar second surfaces 100 comprising the ball-grid arrays 31a, 31b, the second surfaces being located below the top surface, and a bottom surface 95 located below the second surfaces. Portions of the border of the bottom surface 95 are inset from the corresponding portions of the border of the top surface 102 to make the ball-grid array of contacts on the second surfaces 100 accessible from underneath the second surfaces. Because the J-lead connectors fit essentially entirely within the regions underneath the second surfaces, the assembly of FIGS. 4 and 5 occupies essentially the same surface area on a substrate 34 as does the power converter module 30 of FIG. 2.

Each of the bilateral J-lead connectors 28, 29 comprises several electrically independent connection segments. For example, connector 29 comprises four essentially identical segments 37a–37d. Each of the segments 37a–37d comprises two parallel rows (e.g., rows 35a, 35b, FIG. 4b) of connections, each parallel row comprising slots (e.g., slots 40, FIG. 3) that form four compliant fingers (e.g., fingers 33a–33d) within each segment. In a similar fashion, connector 28 comprises five segments: essentially identical segments 41a, 41e, each segment comprising two parallel rows (e.g., rows 35c, 35d, FIG. 4b) of connections, each row of connections comprising six compliant fingers (e.g., compliant fingers 33e–33j, FIG. 3); and essentially identical segments 41b, 41c, 41d, each segment consisting of a single pair of compliant fingers (e.g., fingers 33k, 33L, FIG. 3).

The arrangement of segments, slots and fingers illustrated in FIGS. 3 and 4 is but one example of many possible arrangements that can include, for example, other numbers of segments, other numbers of fingers per segment, unequal lengths of segments, and so forth. The number of fingers in a segment will be selected based upon, e.g., how much current the segment must carry and the permissible heat loss in the segment. Thus, e.g., segment 41e (FIG. 4), comprising six rows of fingers, might carry a relatively high converter output current, while segments 41b, 41c and 41d, each comprising a single row of fingers, might be used for connection to low current control signals.

Opposing pairs of fingers (e.g., fingers 33e and 33m) may be formed from a single piece of conductive material, to form a common connection contact, or they may be formed from separate pieces of conductive material to form a pair of independent connection contacts. Because of their close proximity, pairs of opposing fingers in segments formed of pairs of independent connections will exhibit relatively low values of parasitic inductance compared, e.g., to the parasitic inductance between segments formed of common connection contacts located at different positions along a row. For example, if rows of opposing fingers 35a and 35b in FIG. 4B are formed of independent connections and the rows are used for making connection to the positive and negative voltage terminals of the converter, the parasitic inductance associated with the two rows of contacts will be relatively low owing to the close proximity of the opposing rows of fingers. On the other hand, if the positive and negative voltage terminals of the converter are brought out by use of adjacent segments (e.g., segments 37a, 37b, FIGS. 3 and 4D), with each segment being formed of common connection contacts that form a single contact point, the relatively wide spacing between the segments will result in a relatively much higher value of parasitic inductance for the connections.

FIGS. 6 through 12 show steps in the manufacture of bilateral J-lead connectors 28, 29, in which the segments comprise common connection contacts having opposing fingers formed from a single piece of conductive material.

Figure 6:
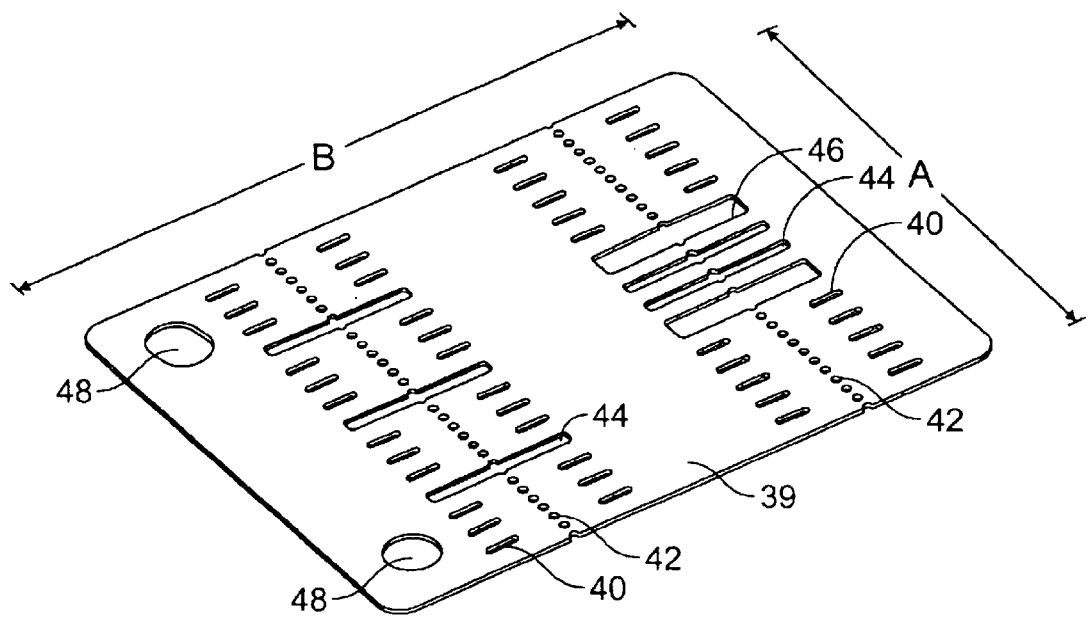
FIG. 6 shows a conductive metal piece used as part of a connector system.

FIG. 6 shows a flat piece of conductive metal 39 (e.g., palladium plated copper, of thickness 0.010 inches (0.25 mm), and of width A=1.224 inches (3.11 cm) and length B=1.565 inches (3.98 cm) comprising slots and holes 40, 42, 44, 46, 48. Some of the slots (e.g., slots 40) define the finger locations and some (e.g., slots 44, 46) define spaces between electrically isolated segments.

Figure 7:
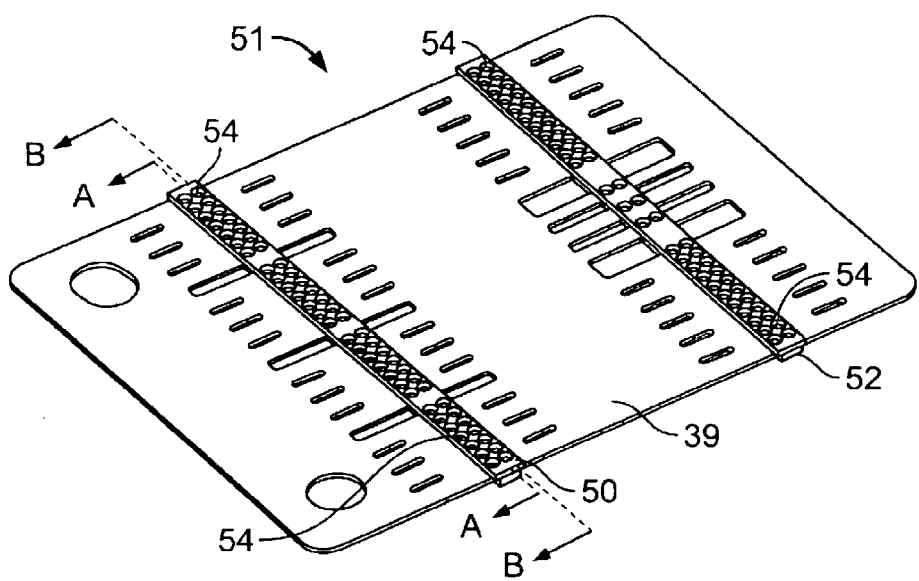
FIG. 7 shows an assembly of the metal piece of FIG. 6 and plastic ribs.
Figure 8B:
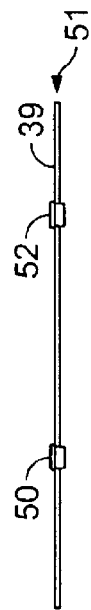
FIGS. 8A–8D show orthographic views of the assembly of FIG. 7.
Figure 8D:
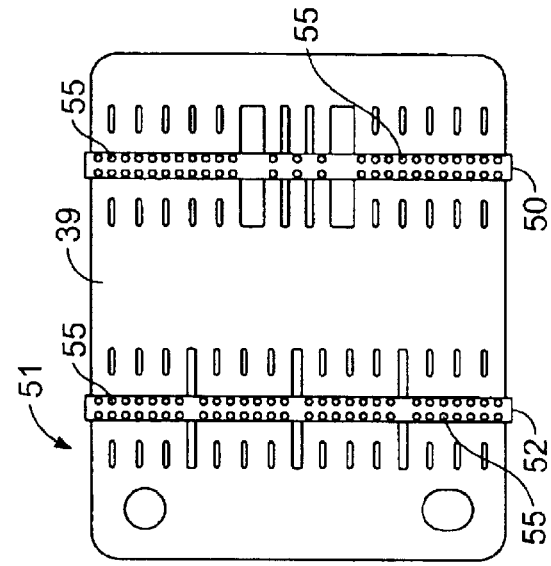
Figure 8A:
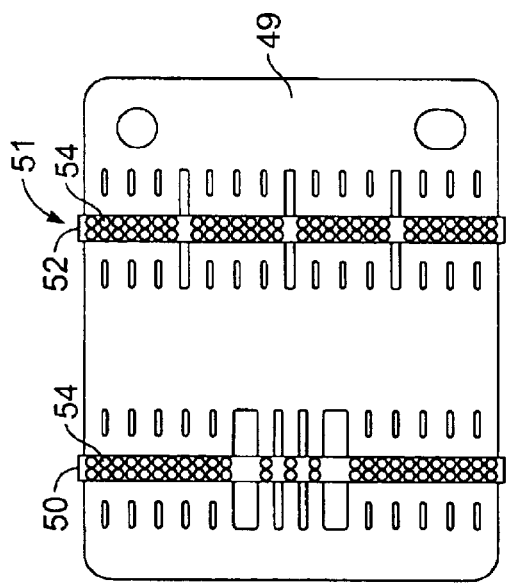
Figure 8C:
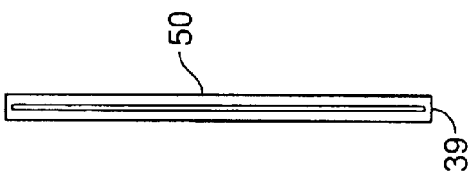
Figure 11:
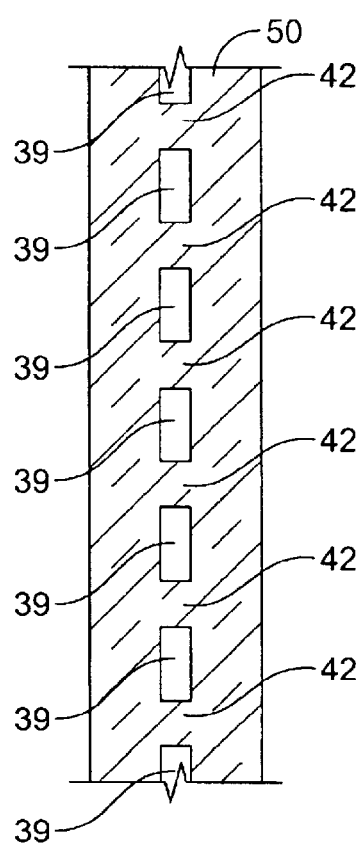
FIG. 11 shows a cross section of the assembly of FIG. 7.

The conductive metal piece 39 is placed in a mold and plastic ribs 50, 52 (FIG. 7) are molded in place. FIG. 7 shows an exploded perspective view, and FIGS. 8A through 8D show, respectively, top, end, side and bottom plan views, of an assembly 51 comprising the conductive metal piece 39 and molded plastic ribs 50, 52, after the molding process is completed. As shown in FIG. 11, which shows a sectional view of the assembly 51 taken at the location marked AA in FIG. 7, the plastic material that forms the rib 50 fills the anchor holes 42 (FIG. 6, 12) in the conductive piece 39, to firmly affix the rib 50 to the conductive piece 39. Holes 48 are used to locate the piece 39 in the mold during the molding of the rib.

The pattern of holes 54 in the ribs 50, 52 on the top side of the assembly 51 defines regions free of plastic for making connections between the solder-ball-grid array (e.g., grid-array 31a, FIG. 3) on a converter module 30 and the conductive segments of the finished bilateral J-lead connectors 28, 29. Another pattern of holes 55, located in the rib on the bottom side of the assembly 51 (FIG. 8D), each hole 55 being located concentric with and directly beneath one of the top side holes 54, and each hole 55 having a smaller diameter than the holes 54, is used to aid in the molding process, as described below.

Figure 12:
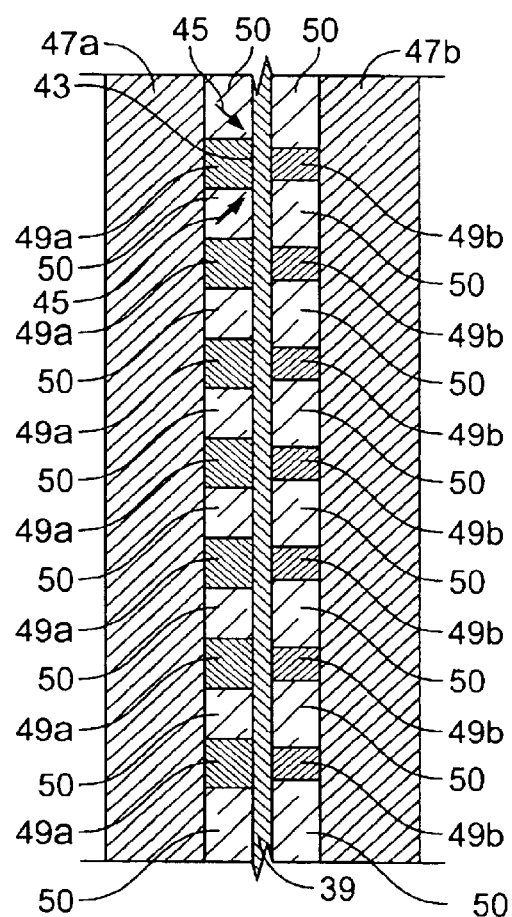
FIG. 12 shows a cross section of a mold during the molding of the assembly of FIG. 7.

It is useful to keep the surface of the conductive piece 39 within the region of each of the top-side holes 54 free of plastic molding compound. Otherwise, it may not be possible to form a proper solder joint when the connectors are soldered to the ball-grid array on the power converter. To ensure that the regions remain free of plastic material, the conductive piece 39 may be insert-molded using a mold design of the kind illustrated in FIG. 12. FIG. 12 shows a schematic cross sectional view of the assembly 51 of FIG. 7, taken at the location marked BB in FIG. 7, with the assembly 51 in the mold after the plastic which forms the rib 50 has been injected into the mold. A left mold half comprises left mold plate 47a and a plurality of round pins 49a, each pin corresponding to one of the top side holes 54 in rib 50. A right mold half comprises right mold plate 47b and a plurality of pins 49b, each pin corresponding to one of the bottom-side holes 55 in rib 50. When the mold is closed, pins 49a and 49b are forced to be in contact with the surfaces of conductive piece 39 at concentric locations on opposite sides of the piece. During the molding process the material that forms the rib (shown as portions of molded rib 50 in FIG. 12) is injected into the mold under pressure. Without pins 49b, this pressure (as indicated in one location in FIG. 12 by the arrows 45) might cause a small gap to form at region 43 between the bottoms of pins 49a and the surface of the conductive piece 39. The force exerted by the presence of the pins 49b directly beneath pins 49a, however, provides support within the mold that prevents this gap from forming. By this means, the surface of the conductive piece 39 below the pins 49a is kept free of extraneous plastic material.

Figure 9A:
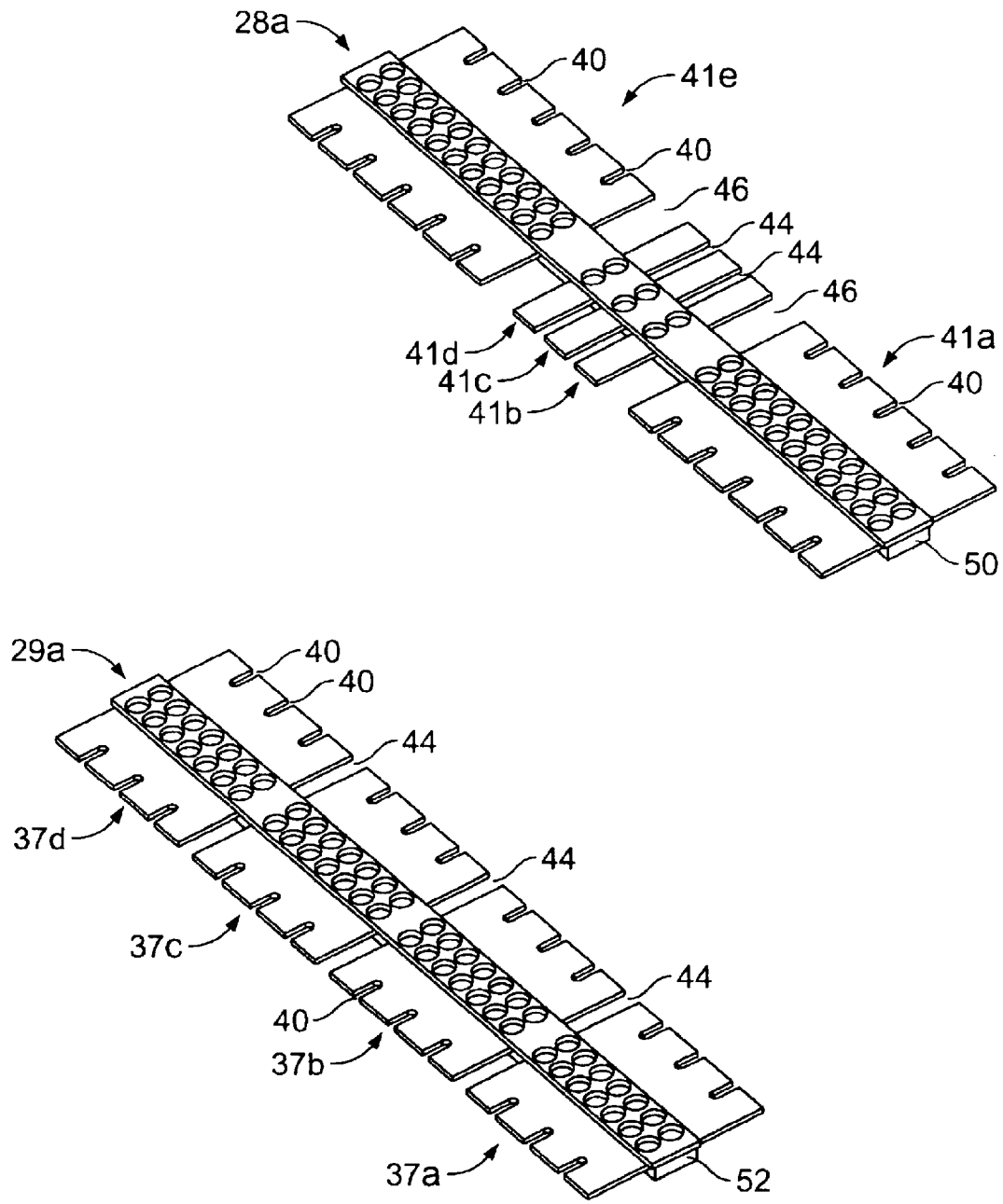
FIGS. 9A–9E show perspective and orthographic views of the assembly of FIG. 8 after cutting away portions of the conductive plate.
Figure 9B:
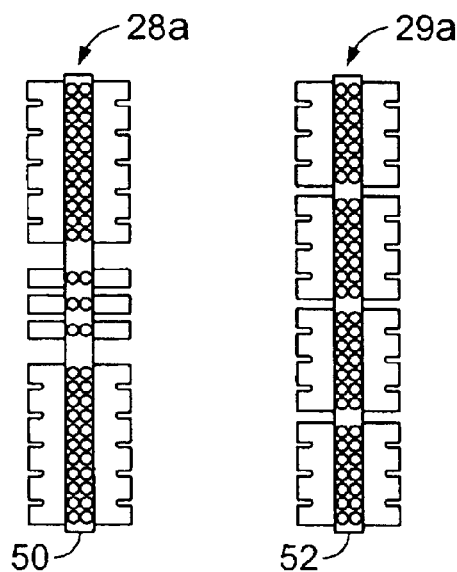
Figure 9C:
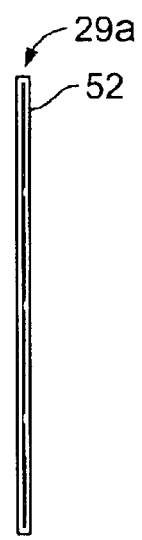
Figure 9D:
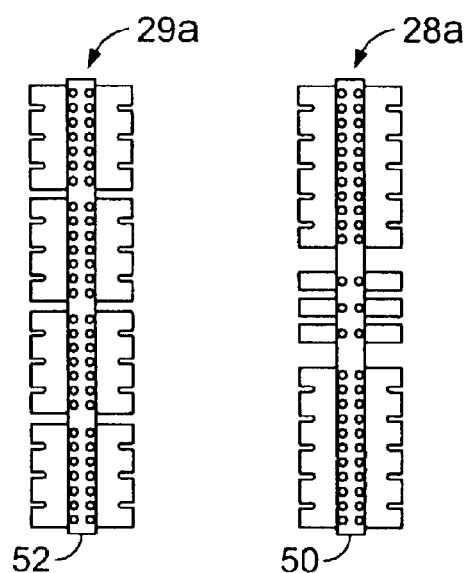
Figure 9E:
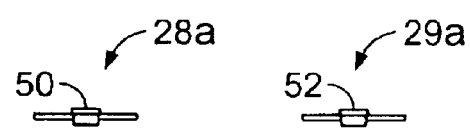
Figure 10A:
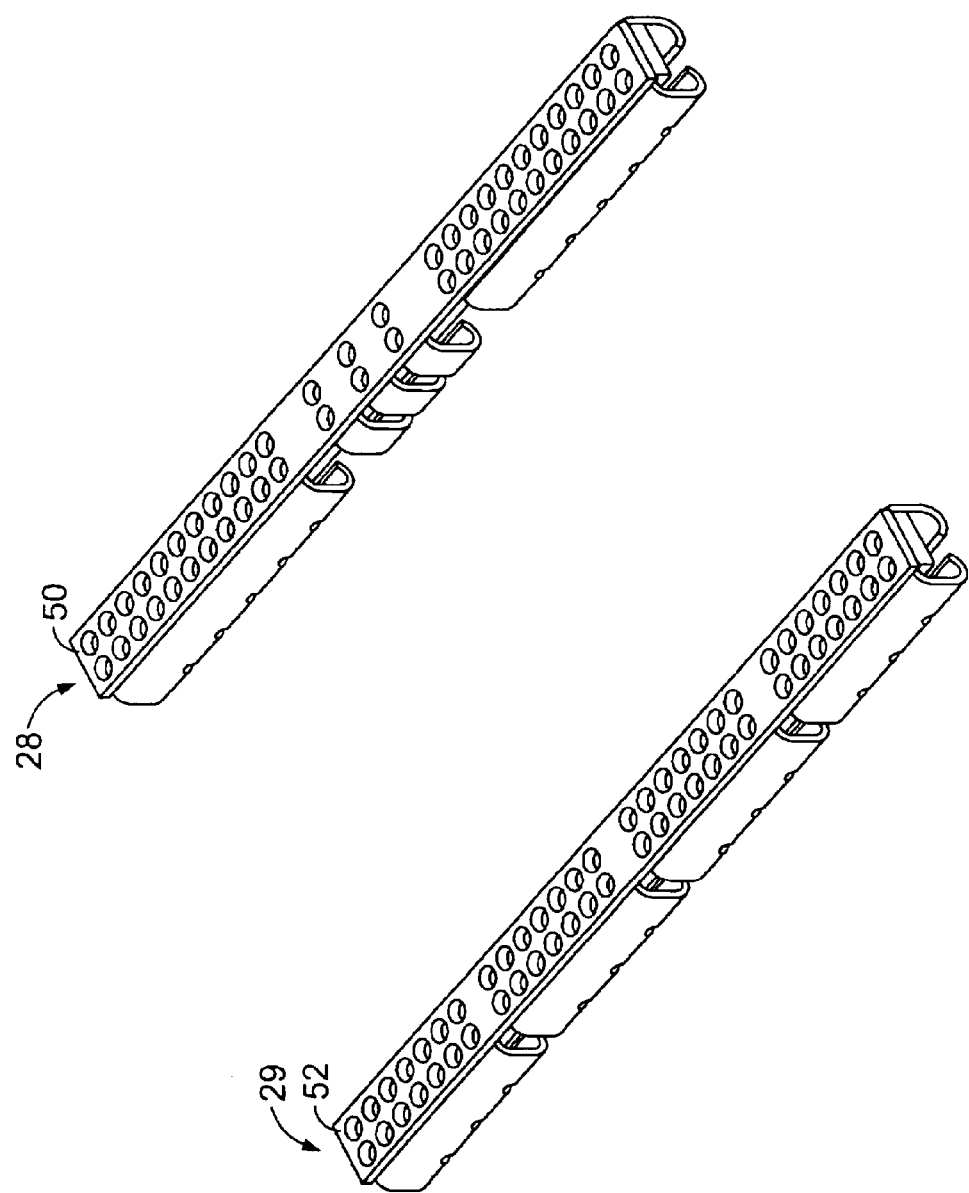
FIGS. 10A–10F show perspective and orthographic views of the connector segments of FIG. 9 after forming the leads.
Figures 10B, 10C, 10D, 10E:
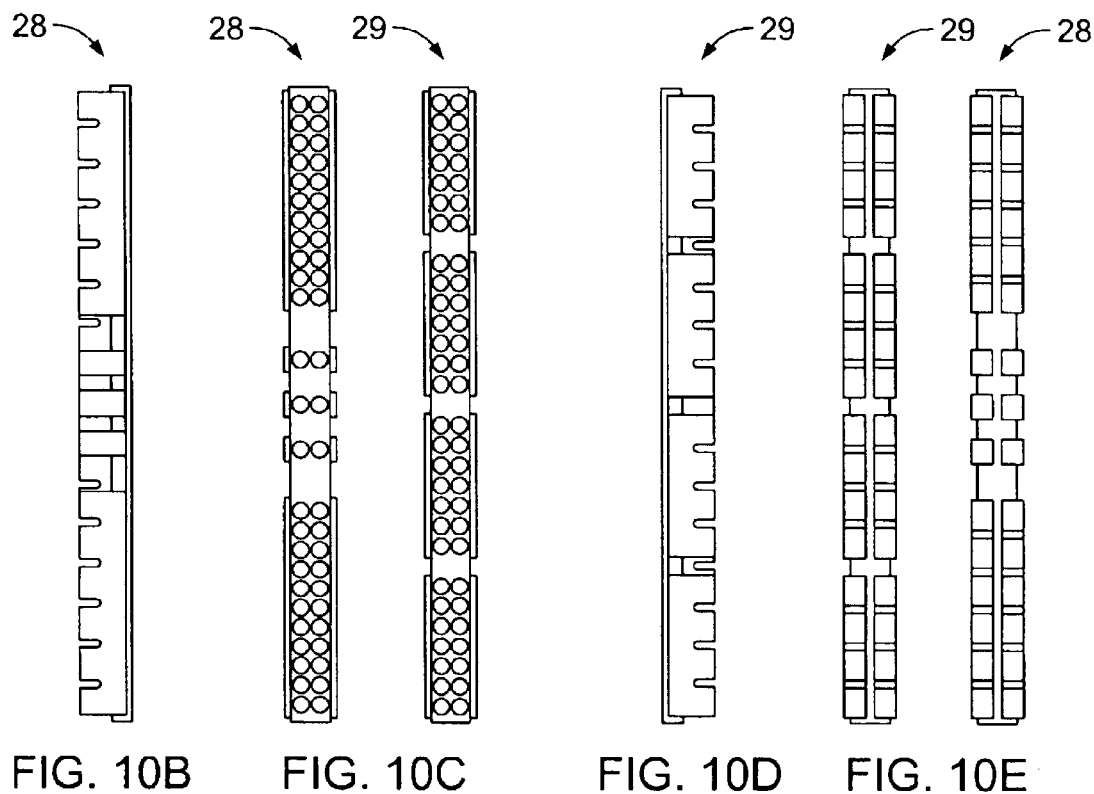
Figure 10F:
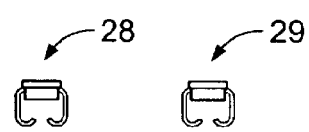

After the ribs have been molded onto the conductive piece 39, portions of the conductive piece are cut away to yield two connector sections 28a, 29a, as illustrated in the perspective view of FIG. 9A and the orthographic views of FIGS. 9B through 9E. In a later manufacturing step, the flat portions of the conductive pieces that extend from the ribs are folded to form the final configuration of the bilateral J-lead connectors 28, 29, as illustrated in the perspective view of FIG. 10A and the orthographic views of FIGS. 10B through 10F.

Figure 13:
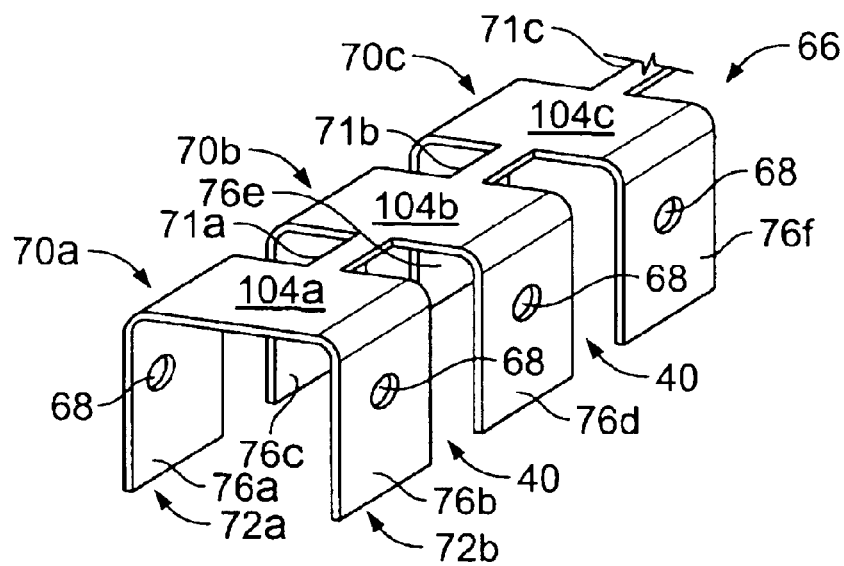
FIG. 13 shows a conductive metal piece used to form another connector system according to the invention.
Figure 14:
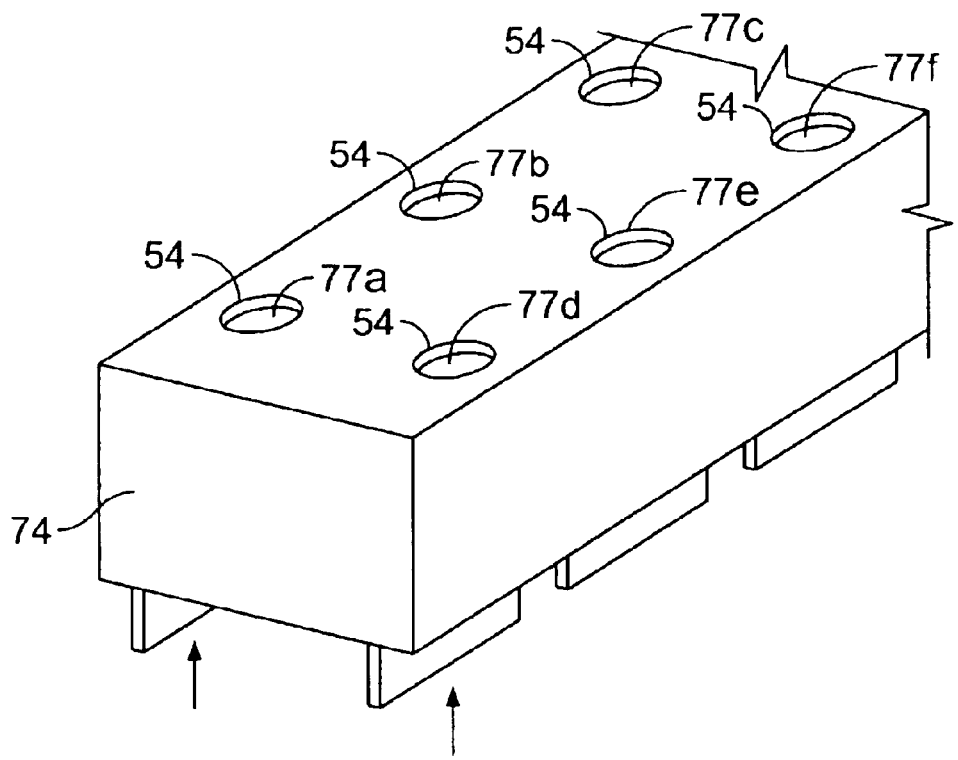
FIG. 14 shows an assembly comprising the metal piece of FIG. 13 and a plastic rib.
Figure 15:
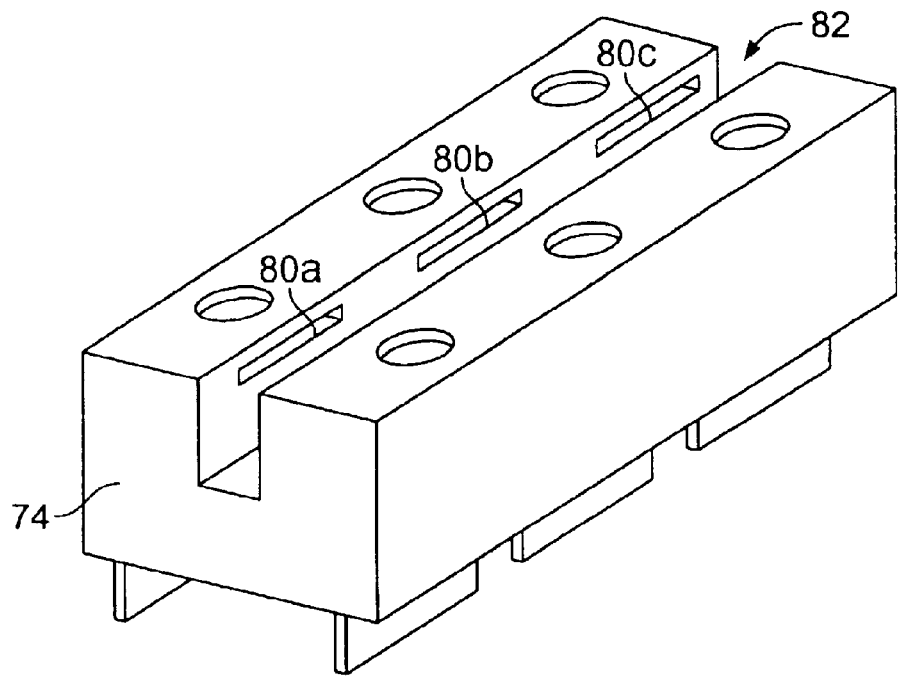
FIG. 15 shows the assembly of FIG. 14 including a slot.

Steps in the manufacture of bilateral J-lead connectors 28, 29, in which the segments comprise independent connection contacts having opposing fingers formed from separate pieces of conductive material, are illustrated schematically in FIGS. 13 through 15.

FIG. 13 shows a piece of conductive metal 66 comprising slots and holes 40, 68. The conductive piece, which may be of the same material and be of the same thickness as the piece shown in FIG. 6, has been pre-folded from a flat piece of material into a generally U-shaped arrangement. Slots 40 separate portions of the conductive piece 66 that comprise opposing pairs of legs (e.g., opposing pairs of legs 76a, 76b; opposing pair of legs 76c, 76d; opposing pair of legs 76e, 76f), the legs in each opposing pair being parallel to each other and connected at an essentially right angle to a spanning portion (e.g., spanning portions 104a, 104b, 104c, FIG. 13) that connects the pair of legs. The separated portions are connected to each other by means of straps (e.g., straps 71a, 71b, 71c). The ends of the legs (e.g., ends 72a, 72b) may be unformed, as shown in FIG. 13 (and be formed into J-leads in a later step) or they may be pre-formed into a J-lead arrangement (not shown).

As illustrated schematically in FIG. 14, the conductive metal piece 66 is placed in a mold and a plastic rib 74 is molded in place. A pattern of holes 54 in the rib 74 defines regions free of plastic for making connections between the solder-ball-grid array (e.g., grid-array 31a, FIG. 3) on a converter module 30 and regions on the surface of the conductive segments of the finished connector 77a–77f, analogous to the counterpart holes 54 described with respect to FIGS. 6–10. Another pattern of holes 55, located in the rib on the bottom side of the assembly 51 (not shown in FIG. 14), perform the same support function during the molding process as the counterpart holes 55 described above with reference to FIG. 8. The plastic material that forms the rib 74 fills anchor holes 68 (FIG. 13) in the conductive piece 66, thereby firmly affixing the rib 74 to the conductive piece 66.

As illustrated in FIG. 15, in another manufacturing step a slot 82 is cut along the top of the rib 74. The slot is sufficiently wide to completely cut away the straps (e.g., straps 71a–71c, FIG. 13) and sever each U-shaped portion into a pair of electrically disconnected legs. Severed ends 80a, 80b, 80c of, respectively, legs 76a, 76c, 76e are illustrated in FIG. 15. In a subsequent manufacturing step, the slot 82 may be filled with material (not shown) to, e.g., provide insulation between opposing severed ends of legs or to prevent contamination of severed ends. In a further manufacturing step, the ends of the legs (e.g., ends 72a, 72b) may be formed into J-leads.

Figure 16:
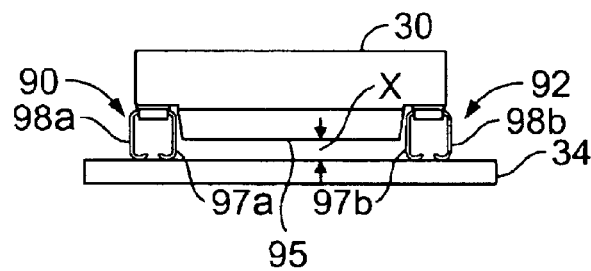
FIG. 16 shows an end view of an assembly.
Figure 17:
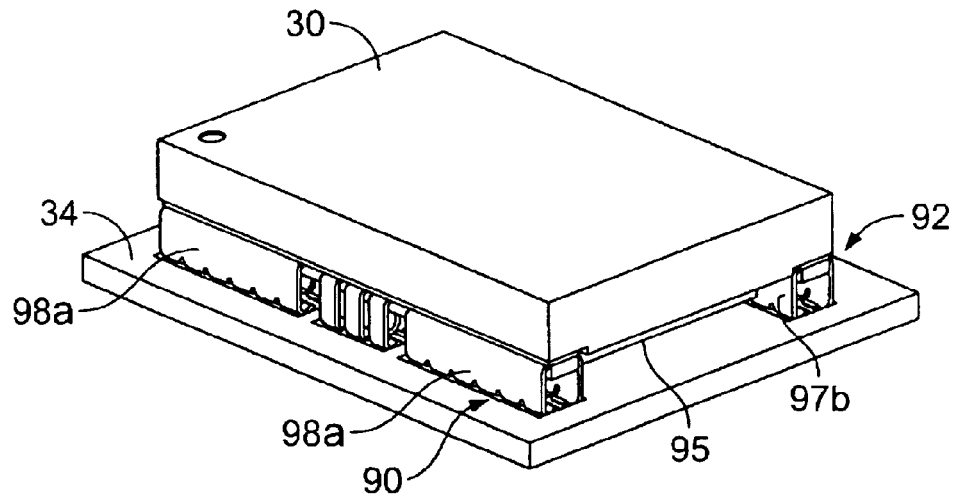
FIG. 17 shows a perspective view of the assembly of FIG. 16.

Extending the length of the J-lead connectors may provide additional advantages. FIGS. 16 and 17 show end and perspective views of an assembly having the same general features of the assembly of FIGS. 3 and 5, except that the bilateral J-connectors 90, 92 in the assembly of FIGS. 16 and 17 are of longer length than the bilateral J-connectors 28, 29 in the assembly of FIGS. 3 and 5. The longer length of the bilateral J-connectors result in a greater distance, X (FIG. 16) between the lower surface 95 of the power converter 30 and the top surface of the substrate 34. The longer length also causes an increase in the exposed surface area of the bilateral J-connectors 90,92.

Cooling of the power converter module 30 of FIGS. 16 and 17 is improved over that of the power converter module of FIGS. 3 and 5 because the increased distance, X, provides a relatively larger space through which cooling air can flow, thereby enabling the cooling air to more easily extract heat from the lower surface 95 of the power converter 30 and from the increased surface area of the inner surfaces (e.g., surfaces 97a, 97b, FIG. 16) of the bilateral J-connectors. In addition, the increased surface area of the outer surfaces (e.g., surfaces 98a, 98b, FIG. 16) of the bilateral J-connectors provide for more efficient transfer of heat into the surrounding air.

In some cases the distance X is arranged to be twice the minimum length that would otherwise be required to avoid putting an aperture in the substrate (e.g., twice the value of "H", discussed above with reference to FIG. 5).

Figure 18:
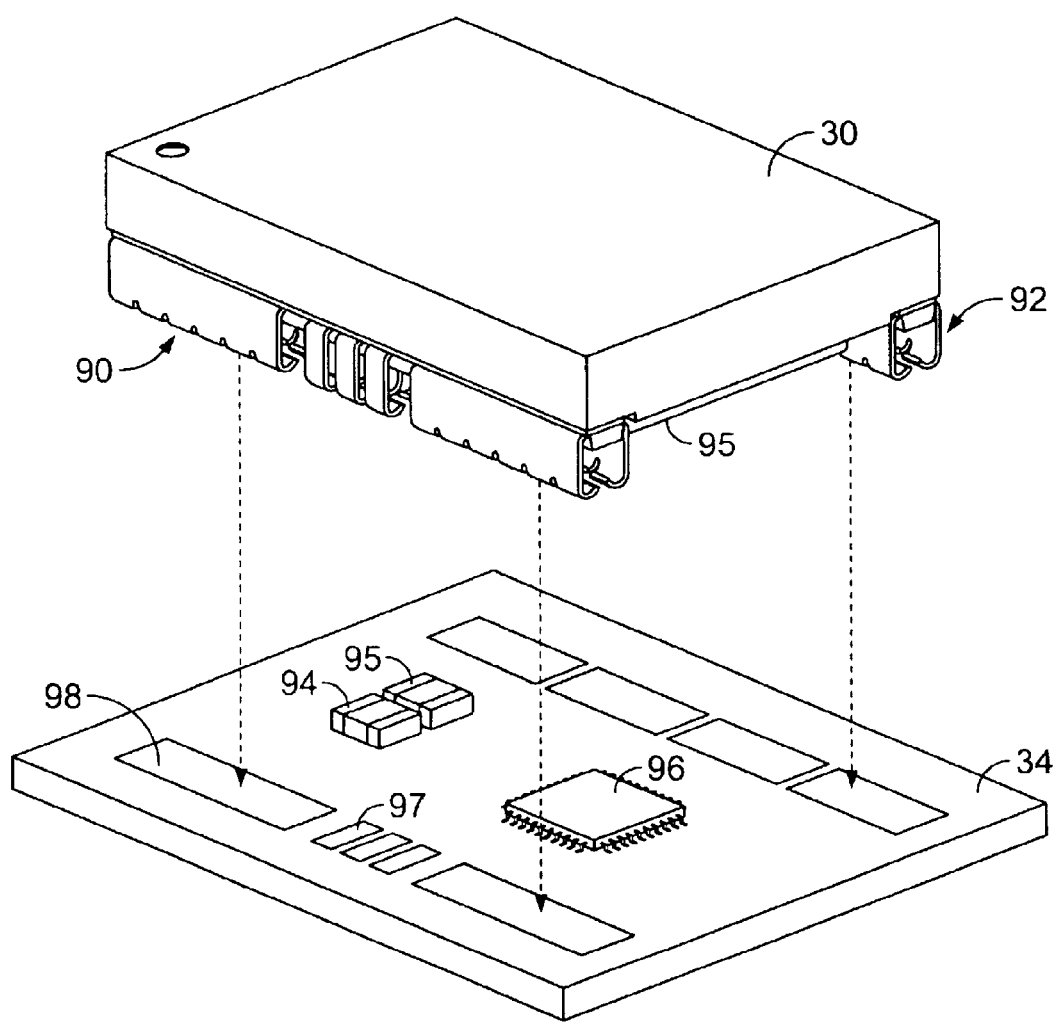
FIG. 18 shows an exploded perspective view of the assembly of FIG. 17 comprising components underneath the body of the power converter.

Another advantage of longer length is that components 94, 95, 96 may be mounted on the substrate 34 in the region underneath the power converter 30, as illustrated in FIG. 18.

Other implementations are also within the scope of the following claims. For example, the ends of the legs may be formed into a shape different from a J-lead.

What is claimed is:

1. Apparatus comprising
a power converter comprising electrical contacts arranged on a first surface, the converter having a top surface above the first surface and a bottom surface below the first surface, a border of the bottom surface being inset from a border of the first surface,
a connection device comprising a pair of conductive legs, each leg comprising a first end and a second end, the pair of legs lying opposite each other in a pair of evenly spaced planes that intersect the first surface,
the first ends adapted to connect to one or more of the contacts on the first surface and the second ends adapted to connect to one or more conductive pads on a surface of a substrate,
the connection device being adapted to enable the first ends of the two legs to connect to the contacts from below the first surface.

2. The apparatus of claim 1 wherein the first ends and second ends of respective legs are spaced apart by a distance that is greater than a distance between the first surface and the bottom surface.

3. The apparatus of claim 2 wherein the distance is essentially equal to the maximum distance between the first surface and the bottom surface so that the bottom surface is just above, and in close proximity to, the surface of the substrate.

4. The apparatus of claim 2 wherein the distance is greater than the maximum distance between the first surface and the bottom surface so that a gap exists between the bottom surface and the surface of the substrate.

5. The apparatus of claim 2 wherein the distance is twice the value of the maximum distance between the first surface and the bottom surface.

6. The apparatus of claim 1 comprising two or more pairs of legs in the pair of planes.

7. The apparatus of claim 1 wherein the pair of legs are part of a strip of conductive material bent to form the pair of legs, each leg connected at a right angle to a spanning portion of the strip, the pair of legs being electrically connected together by the spanning portion.

8. The apparatus of claim 7 wherein the spanning portion comprises the first ends of each of the two pair of legs.

9. The apparatus of claim 1 wherein the legs of the pair are formed from separate pieces of conductive material.

10. The apparatus of claim 1 wherein the second end of each leg is formed into a J.

11. The apparatus of claim 10 wherein the J end of each leg is directed inward toward the other leg so that the two ends of the Js lie between the pair of legs.

12. The apparatus of claim 1 comprising two or more pairs of legs held together by a non-conductive rib.

13. The apparatus of claim 12 wherein the rib comprises a hole that exposes a portion of a pair of legs to form a first end.

14. The apparatus of claim 12 wherein each of the pairs of legs comprises a strip of conductive material bent to form the pair of legs, each leg connected at a right angle to a spanning portion of the strip, the pair of legs being electrically connected together by the spanning strip, and wherein the rib comprises a hole that exposes a portion of the spanning strip to form a first end.

15. The apparatus of claim 14 wherein the legs of a pair is formed from separate pieces of conductive material and wherein the rib comprises holes that expose a portion of each leg to form a first end.

16. The apparatus of claim 15 wherein the rib connects the pairs of legs so that the legs lie in the pair of planes.

17. The apparatus of claim 1 wherein the top and bottom surfaces are planar and are parallel to each other and to the first surface.

18. The apparatus of claim 1 wherein the electrical contacts are part of a ball-grid array.

19. The apparatus of claim 1 wherein the conductive pads comprise conductive etch.

20. A method for making connections between a power converter and conductive pads located on a substrate, the method comprising:
providing a power converter having electrical contacts arranged on a first surface, the converter having a bottom surface below the first surface, a border of the bottom surface being inset from a border of the first surface; and
interposing between the contacts and the substrate, conductive segments that comprise two generally parallel conductive legs, each leg comprising a first end and a second end, the first ends of the two legs being connected to one or more of the electrical contacts and the second ends extending to a location below the bottom surface and connecting to one of more of the pads.

21. The method of claim 20 further comprising,
providing additional conductive segments, each conductive segment comprising pairs of generally parallel legs, and
arranging the segments in a row using a non-conductive rib so that the generally parallel legs in each segment lie in two generally parallel planes.

22. The method of claim 20 further comprising,
providing a ball-grid array of electrical contacts on the power converter;
providing holes in the rib to expose portions of first ends at locations along the rib that align with the locations of the balls in the ball-grid array, and
soldering the ball-grid array to the exposed locations of the spanning portions.

23. The method of claim 20 further comprising folding the free ends of the legs into a J, and soldering the J-shaped portions of the free ends to the conductive pads on the substrate.

* * * * *

UNITED STATES PATENT AND TRADEMARK OFFICE
CERTIFICATE OF CORRECTION

| | | |
|---|---|---|
| PATENT NO. | : 6,940,013 B2 | Page 1 of 1 |
| APPLICATION NO. | : 10/714323 | |
| DATED | : September 6, 2005 | |
| INVENTOR(S) | : Patrizio Vinciarelli, Jay Prager and Michael B. LaFleur | |

It is certified that error appears in the above-identified patent and that said Letters Patent is hereby corrected as shown below:

In the specification:

Column 1, Lines 24-25, "(e.g., 0.040" (11.0mm))" should be replaced with --(e.g., 0.040" (1.0mm))--

Signed and Sealed this

Eighteenth Day of July, 2006

JON W. DUDAS
*Director of the United States Patent and Trademark Office*